(12) United States Patent
Koo (10) Patent No.: US 9,018,707 B2
(45) Date of Patent: Apr. 28, 2015

(54) SEMICONDUCTOR DEVICE

(75) Inventor: Min Gyu Koo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 189 days.

(21) Appl. No.: 13/601,681

(22) Filed: Aug. 31, 2012

(65) Prior Publication Data

US 2013/0161752 A1    Jun. 27, 2013

(30) Foreign Application Priority Data

Dec. 21, 2011 (KR) .......................... 10-2011-0139047

(51) Int. Cl.
  *H01L 21/70* (2006.01)
  *H01L 27/088* (2006.01)
  *H01L 27/02* (2006.01)

(52) U.S. Cl.
  CPC .......... *H01L 27/088* (2013.01); *H01L 27/0207* (2013.01)

(58) Field of Classification Search
  CPC . H01L 29/4238; H01L 29/7835; H01L 29/41; H01L 29/41725; H01L 29/41758; H01L 27/0207; H01L 27/088
  USPC .............................. 257/368, E27.06, E29.268
  See application file for complete search history.

(56) References Cited

U.S. PATENT DOCUMENTS

2008/0290419 A1* 11/2008 Leibiger ....................... 257/369

* cited by examiner

*Primary Examiner* — Shaun Campbell
(74) *Attorney, Agent, or Firm* — William Park & Associates Ltd.

(57) ABSTRACT

A semiconductor device includes a first transistor group including first transistors, wherein each of the first transistors includes a first gate, and a first source and a first drain disposed symmetrically at both sides of the first gate and having a bent form; and a second transistor group including second transistors, wherein each of the second transistors includes a second gate, and a second source and a second drain disposed symmetrically at both sides of the second gate and having a bent form, wherein the first source and the first drain are bent in a direction opposite to a direction in which the second source and the second drain are bent.

10 Claims, 8 Drawing Sheets

SEMICONDUCTOR DEVICE

CROSS-REFERENCE TO RELATED APPLICATION

Priority is claimed to Korean patent application number 10-2011-0139047 filed on Dec. 21, 2011, the entire disclosure of which is incorporated herein by reference in its entirety.

BACKGROUND

Various embodiments relate generally to a semiconductor device and, more particularly, to a semiconductor device including transistors.

In order to increase a degree of integration, the size of transistors has been reduced. Thus, although transistors are designed to be adaptive for a high voltage transmission, if the size thereof is reduced, the transistors may be damaged.

Figure 1:
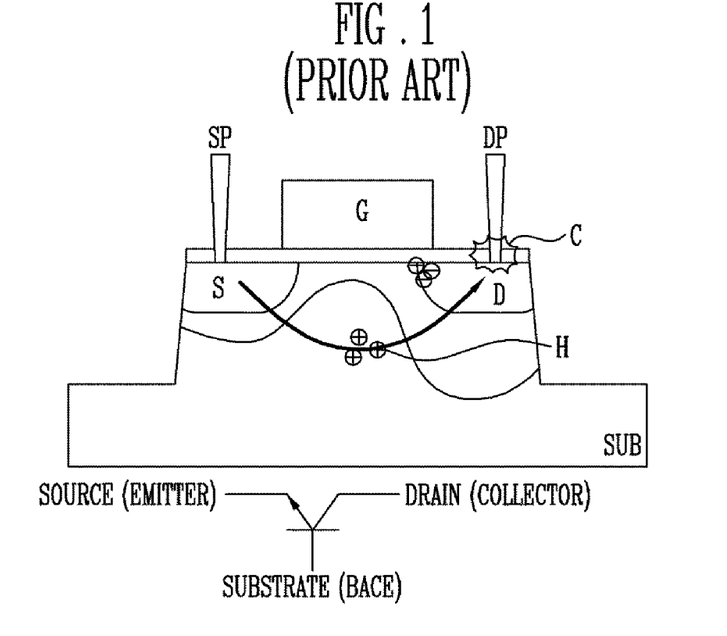
FIG. 1 is a conventional cross-sectional view illustrating a snapback phenomenon causing a transistor to be damaged.

FIG. 1 is a cross-sectional view illustrating a snapback phenomenon causing a transistor to be damaged.

Referring to FIG. 1, a transistor includes a gate G, a source S, and a drain D. Plugs SP and DP are connected to the source S and the drain D, respectively. Damage of the transistor may be caused due to a snapback phenomenon in a channel-off state. When a voltage is applied to the drain D, a drain potential is increased and electric hole pairs are formed in the gate G, increasing an amount of holes transferred to a substrate SUB. Accordingly, a bipolar action is made due to an instantaneous turn-on phenomenon between the source S and the drain D, rapidly increasing a current. The current increased by such a snapback phenomenon is a high current enough to melt a contact C, resulting in the contact D and the plug DP made of a metal to be burnt through joule heating.

BRIEF SUMMARY

Various embodiments relate to a semiconductor device in which a structure is modified to enhance electrical characteristics and a degree of integration.

A semiconductor device according to an embodiment of the present invention includes: a first transistor group including first transistors, wherein each of the first transistors includes a first gate, and a first source and a first drain disposed symmetrically at both sides of the first gate and having a bent form; and a second transistor group including second transistors, wherein each of the second transistors includes a second gate, and a second source and a second drain disposed symmetrically at both sides of the second gate and having a bent form, wherein the first source and the first drain are bent in a direction opposite to a direction in which the second source and the second drain are bent.

A semiconductor device according to another embodiment of the present invention includes: a plurality of pairs of first transistors, each pair of first transistors including a first source formed on a substrate between a first gate and a second gate, and a first drain and a second drain disposed symmetrically at one side of the first gate and at the other side of the second gate and having a bent form; and a plurality of pairs of second transistors, each pair of second transistors including a second source formed on a substrate between a third gate and a fourth gate, and a third drain and a fourth drain disposed symmetrically at one side of the first third and at the other side of the fourth gate and having a bent form, wherein the first and second drains are bent in a direction opposite to a direction in which the third and fourth drains are bent.

DESCRIPTION OF EMBODIMENTS

Hereinafter, various embodiments of the present disclosure will be described in detail with reference to the accompanying drawings. However, embodiments of the present invention may be implemented in many different forms and should not be construed as being limited to the embodiments set forth herein. Rather, these embodiments are provided so that the disclosure will be thorough and complete, and will fully convey the scope of the invention to those skilled in the art and are defined by the claim coverage of the present invention.

Figure 2:
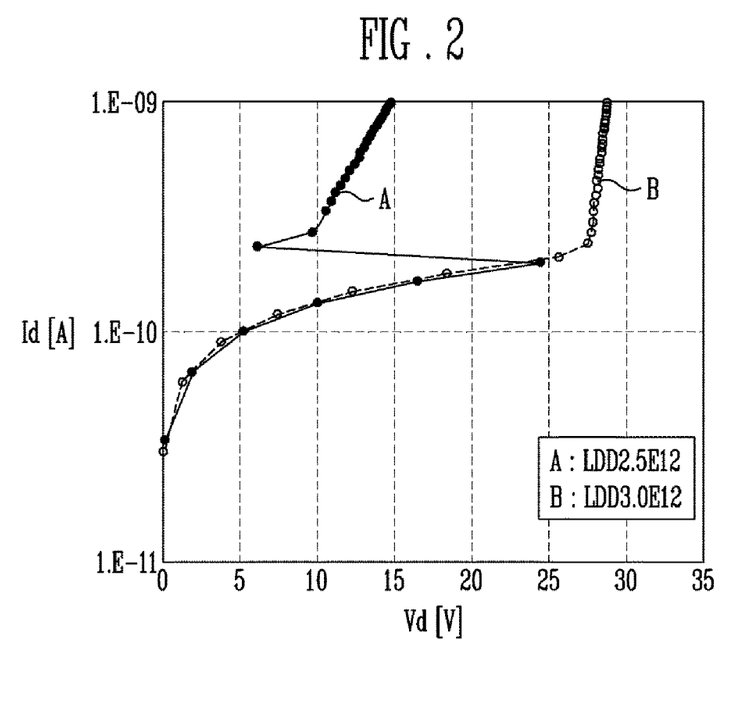
FIG. 2 is a graph showing a snapback phenomenon occurring due to junction resistance in an off state.

FIG. 2 is a graph showing a snapback phenomenon occurring due to junction resistance in an off state.

Referring to FIG. 2, in order to restrain an occurrence of a snapback phenomenon, substrate or junction resistance is lowered or an electric field of a region in which an electric hole pair is generated is reduced. In order to lower the substrate or junction resistance, a well ion doping concentration is required to be raised. Namely, when junction resistance is lowered by raising doping concentration, an occurrence of a snapback phenomenon may be restrained. However, if the doping concentration is raised, it is difficult to normally maintain breakdown voltage characteristics of a high voltage transistor.

Figure 3:
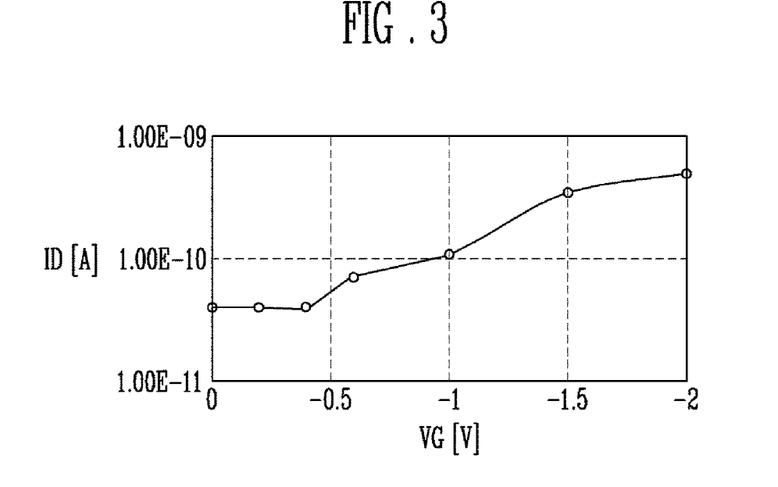
FIG. 3 is a graph showing a change in a snapback trigger current according to a gate potential.

FIG. 3 is a graph showing a change in a snapback trigger current according to a gate potential.

Referring to FIG. 3, the results of checking a change in snapback in an off state by differentiating a gate potential show that a trigger current was changed to improve characteristics. Namely, it can be seen that a reduction in an electric hole pair generation in a region in which a gate and drain junctions overlap stabilizes electrical characteristics.

Figure 4:
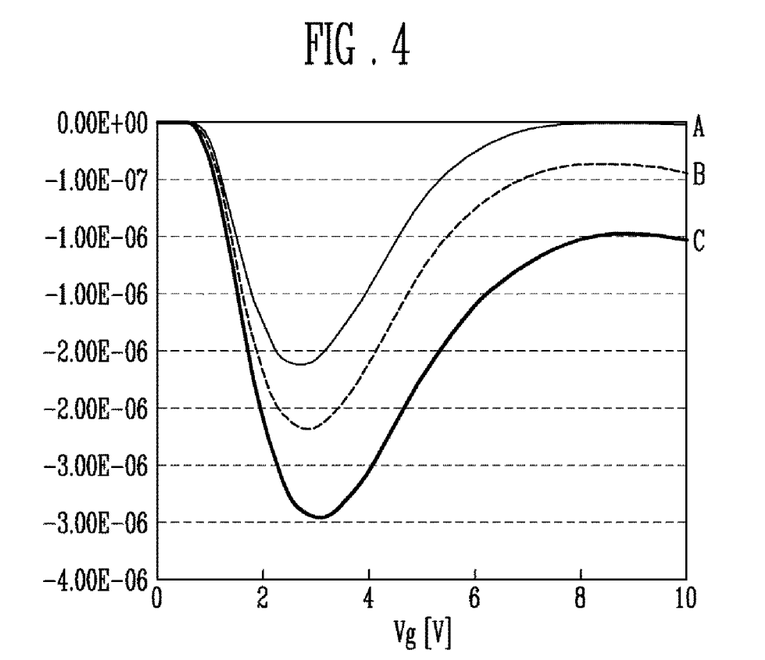
FIG. 4 is a graph showing a change in a current over a distance between a gate and a contact.

FIG. 4 is a graph showing a change in a current over a distance between a gate and a contact.

Referring to FIG. 4, an effect of restraining a snapback phenomenon may be obtained by reducing an electric field according to a distance between a contact and a gate. Namely, a trigger current is increased and a snapback phenomenon in an off state can be restrained, when the distance between the contact and the gate is longer (A) than the case (C) in which the distance therebetween is short. Thus, the distance between the gate and the contact is required to be increased. Here, an increase in the distance results in an increase in the size of the transistor. Thus, a semiconductor device in which the area occupied by transistors is minimized in spite of the increased size of the transistors will be described as follows.

Figure 5:
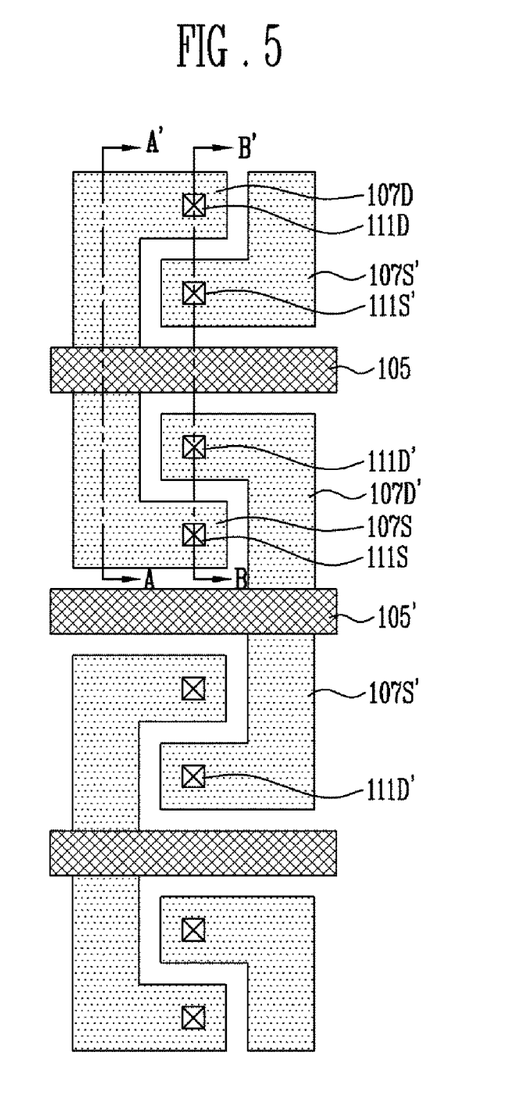
FIG. 5 is a plan view illustrating a semiconductor device according to an embodiment of the present invention.
Figure 6A:
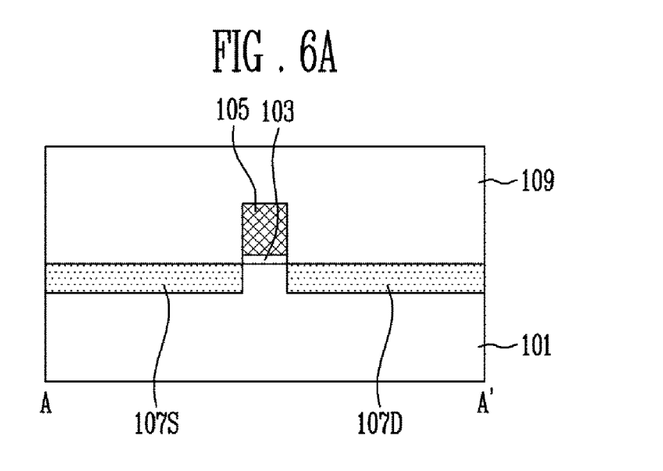
FIGS. 6A and 6B are cross-sectional views illustrating the semiconductor device illustrated in FIG. 5.
Figure 6B:
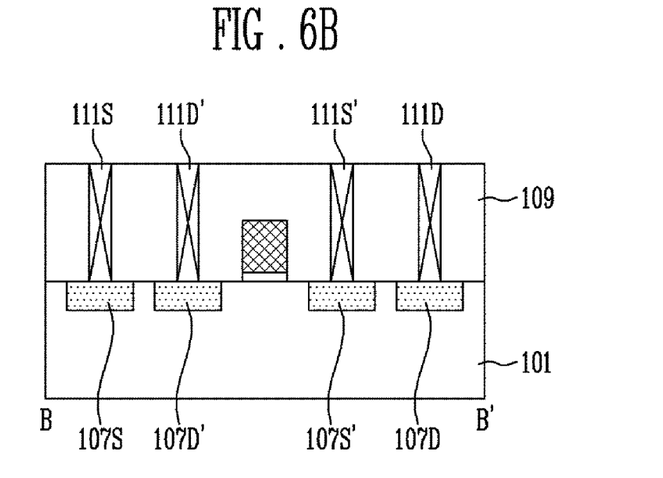

FIG. 5 is a plan view illustrating a semiconductor device according to an embodiment of the present invention. FIGS. 6A and 6B are cross-sectional views illustrating the semiconductor device illustrated in FIG. 5.

Referring to FIGS. 5, 6A, and 6B, the semiconductor device includes a first transistor group and a second transistor group. The first transistor group includes a plurality of first transistors each having a first gate 105, a first source 107S, and a first drain 107D. The second transistor group includes a plurality of second transistors each having a second gate 105', a second source 107S', and a second drain 107D'. The first transistors of the first transistor group and the second transistors of the second transistor group may be arranged in a row. The first transistor group and the second transistor group have structures symmetrical to each other, and the first transistors and the second transistors are arranged in a crisscross manner. This will be described in detail as follows.

The first drain 107D of the first transistor is disposed at one side of the first gate 105 and has a bent form. Namely, the first drain 107D is formed at one side of the gate 105 on a substrate 101 and includes a first portion extending in a direction crossing the first gate 105 and a second portion extending from an end portion of the first portion in a direction parallel to the first gate. The first source 107S may be formed to be symmetrical to the first drain 107D based on the first gate 105.

The second drain 107D' of the second transistor is disposed at one side of the second gate 105' and has a bent form. Namely, the second drain 107D' includes a first portion extending in a direction crossing the second gate 105' and a second portion extending from an end portion of the first portion in a direction parallel to the second gate 105'. The second source 107S' may be formed to be symmetrical to the second drain 107D' based on the second gate 105'.

Here, the second drain 107D' has a shape of being bent in a direction opposite to the direction in which the first drain 107D is bent. Also, the second source 107S' has a shape of being bent in a direction opposite to the direction in which the first source 107S is bent.

An interlayer insulating layer 109 is formed on the entire structure, and a portion of the interlayer insulating layer 109 is etched to form contact holes exposing end portions of the first and second drains 107D and 107D' and end portions of the first and second sources 107S and 107S' therethrough in the interlayer insulating layer 109. Within the contact holes, contact plugs 111D, 111D', 111S, and 111S' are formed on the end portions of the first and second drains 107D and 107D' and the end portions of the first and second sources 107S and 107S', respectively. The contact plugs 111D, 111D', 111S, and 111S' may be arranged in the same line.

In particular, the bent portion of the first drain 107D extends between the second gate 105' and the bend portion of the second source 107S'. Also, the bent portion of the first source 107S extends between the second gate 105' and the bent portion of the second drain 107D'. The first gate 105 may extend between the bent portion of the second drain 107D' included in the second transistor and the bent portion of the second source 107S' included in a different second transistor.

In this manner, since the sources and drains are formed to be bent and the contact plugs are formed on the bent end portions of the sources and drains, a distance between the gates and the contact plugs can be increased to enhance characteristics. The drain of the first transistor and the source of the second transistor are disposed to be engaged, maximizing a space utilization to minimize an increase in the area occupied by the transistors.

A semiconductor device according to another embodiment will be described.

Figure 7:
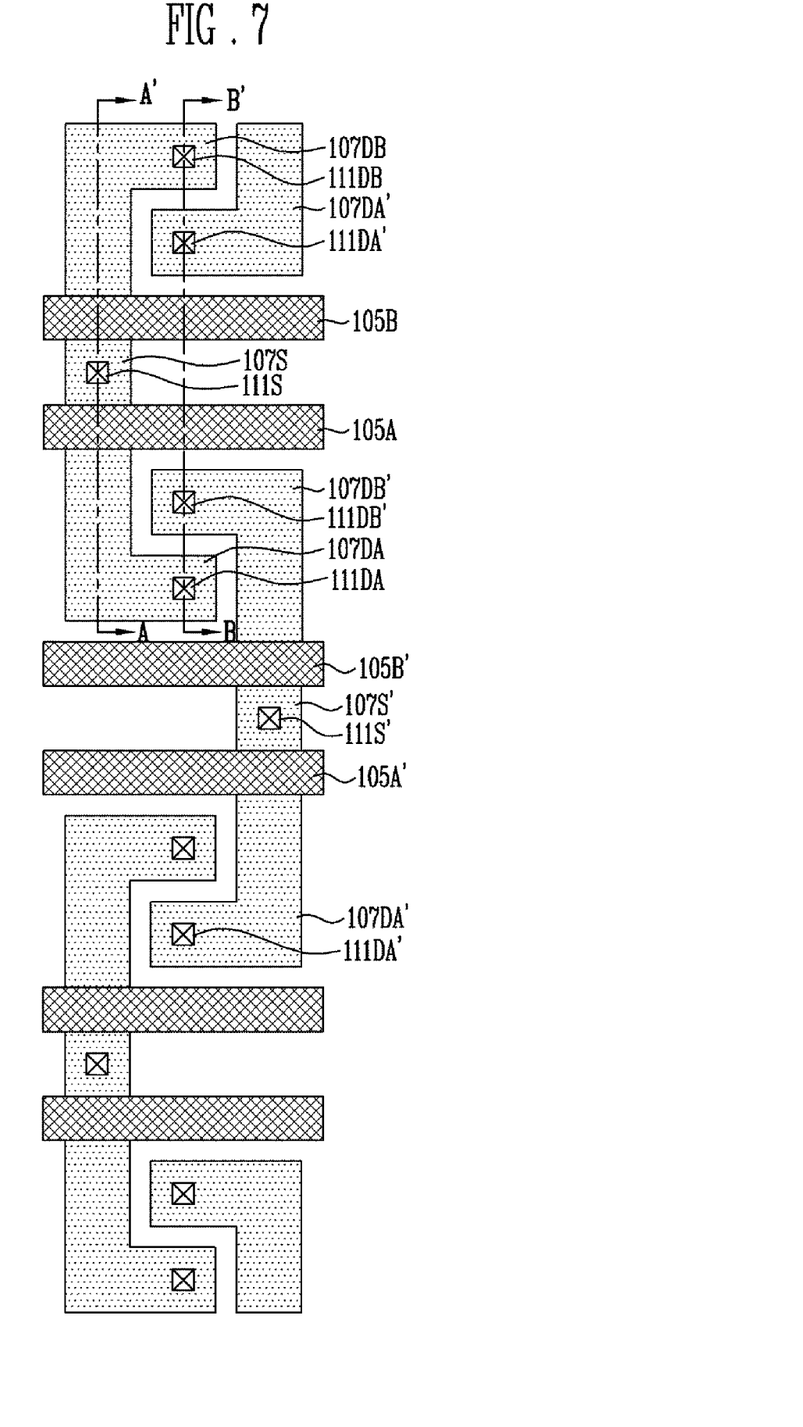
FIG. 7 is a plan view illustrating a semiconductor device according to an embodiment of the present invention.
Figure 8A:
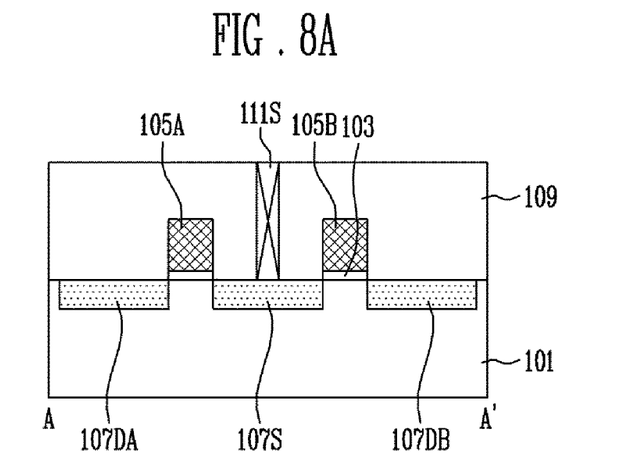
FIGS. 8A and 8B are cross-sectional views illustrating the semiconductor device illustrated in FIG. 7.
Figure 8B:
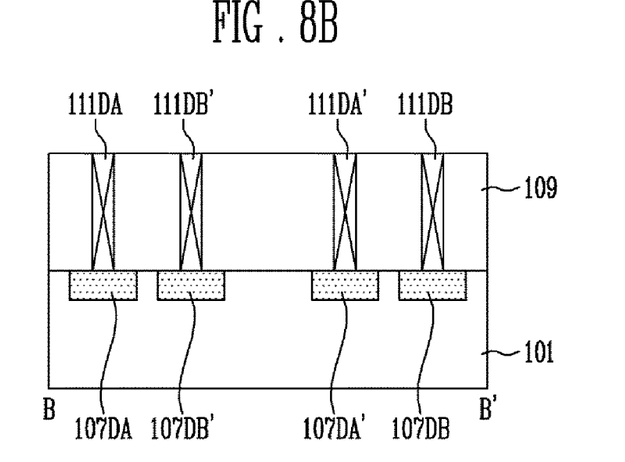

FIG. 7 is a plan view illustrating a semiconductor device according to an embodiment of the present invention. FIGS. 8A and 8B are cross-sectional views illustrating the semiconductor device illustrated in FIG. 7.

Referring to FIGS. 7, 8A, and 8B, a semiconductor device includes a first transistor group and a second transistor group. The first transistor group includes several pairs of first transistors each including first and second gates 105A and 105B, a first source 107S, and first and second drains 107DA and 107DB. The second transistor group includes several pairs of second transistors each including third and fourth gates 105A' and 105B', a second source 107S', and third and fourth drains 107DA' and 107DB'

The first transistors of the first transistor group and the second transistors of the second transistor group may be arranged in a row. The first transistor group and the second transistor group have structures symmetrical to each other, and the first transistors and the second transistors are arranged in a crisscross manner. This will be described in detail as follows.

The first source 107S included in a pair of first transistors of the first transistor group is formed on the substrate 101 between the first gate 105A and the second gate 105B, and the first drain 107DA and the second drain 107DB are disposed to be bent symmetrically at one side of the first gate 105A and the other side of the second gate 105B, respectively.

In detail, the first drain 107DA is formed at one side of the first gate 105A and has a bent form. Namely, the first drain 107DA is formed at one side of the first gate 105A on the substrate 101, and includes a first portion extending in a direction crossing the first gate 105A and a second portion extending from an end portion of the first portion in a direction parallel to the first gate 105A. The second drain 107DB is formed at the other side of the second gate 105B and has a bent form. Namely, the second drain 107DB is formed at the other side of the second gate 105B on the substrate 101 and includes a first portion extending in a direction crossing the second gate 105B and a second portion extending from an end portion of the first portion in a direction parallel to the second gate 105B.

The second source 107S' included in a pair of second transistors of the second transistor group is formed on the substrate 101 between the third gate 105A' and the fourth gate 105B', and the third drain 107DA' and the fourth drain 107DB' are disposed to be bent symmetrically at one side of the third gate 105A' and the other side of the fourth gate 105B', respectively.

The third drain 107DA' and the fourth drain 107DB' have the same shape except that they are bent in a direction opposite to the direction in which the first drain 107DA and the second drain 107DB are bent.

Here, in order to increase a degree of integration by enhancing space efficiency, the bent portions of the third and fourth drains 107DA' and 107DB' included in the second transistor group may extend between the bent portions of the first and second drains 107DA and 107DB included in the first transistor group.

An interlayer insulating layer 109 is formed on the entire structure, and a portion of the interlayer insulating layer 109 is etched to form contact holes exposing end portions of the drains 107DA, 107DA', 107DB, and 107DB' and end portions of the sources 107S and 107S' therethrough in the interlayer insulating layer 109. Within the contact holes, contact plugs 111DA, 111DA', 111DB, 111DB', 111S, and 111S' are formed on the end portions of the drains 107DA, 107DA', 107DB, and 107DB', and the end portions of the first and second sources 107S and 107S', respectively. The contact plugs 111DA, 111DA', 111DB, and 111DB' formed on the drains 107DA, 107DA', 107DB, and 107DB' may be arranged in the same line.

Figure 9:
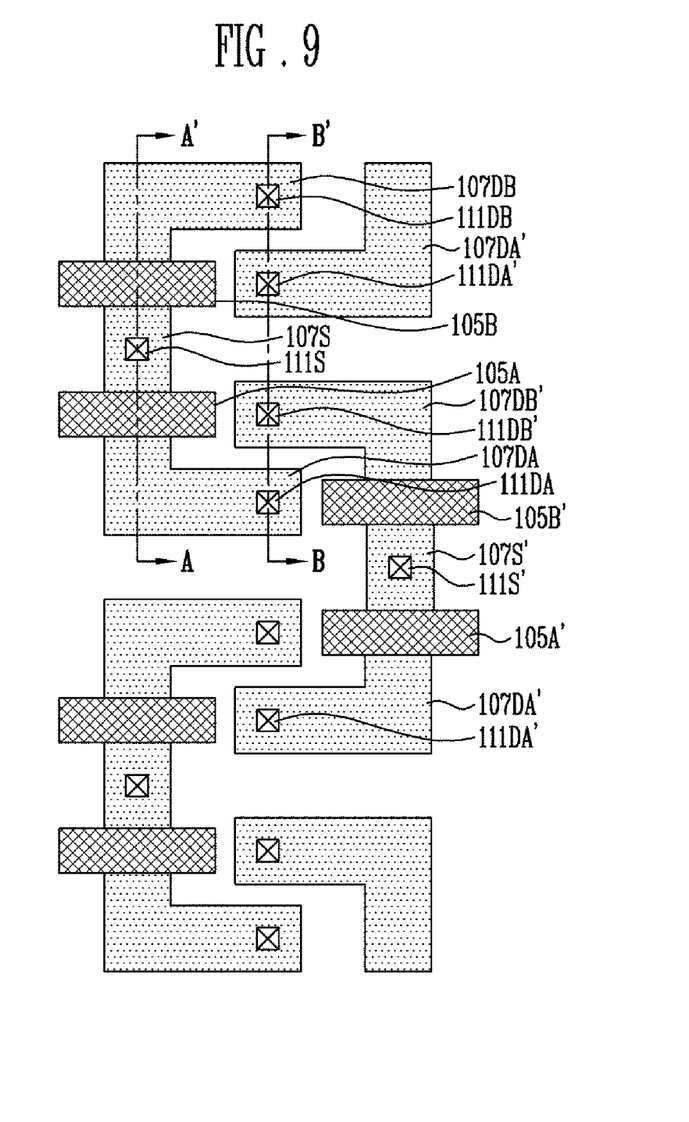
FIG. 9 is a plan view illustrating a semiconductor device according to an embodiment of the present invention.
Figure 10A:
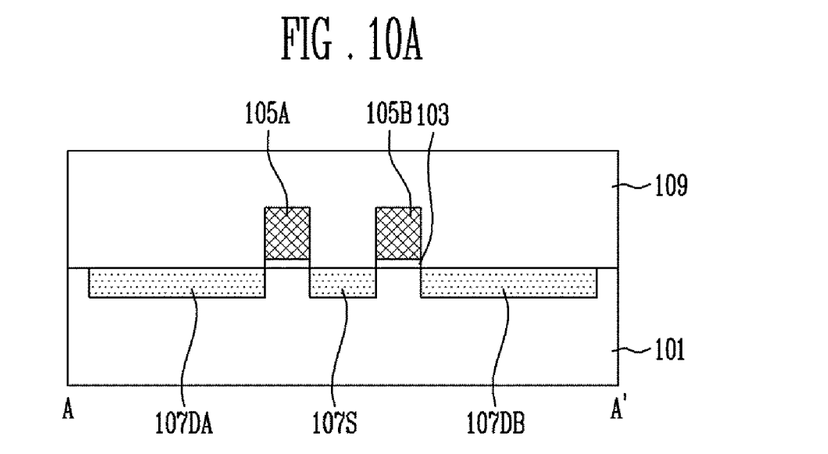
FIGS. 10A and 10B are cross-sectional views illustrating the semiconductor device illustrated in FIG. 9.
Figure 10B:
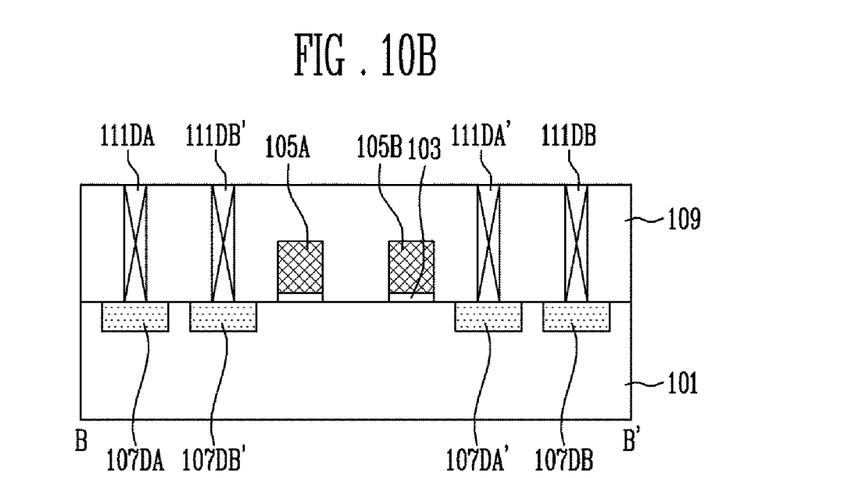

FIG. 9 is a plan view illustrating a semiconductor device according to an embodiment of the present invention. FIGS. 10A and 10B are cross-sectional views illustrating the semiconductor device illustrated in FIG. 9.

Referring to FIGS. 9, 10A, and 10B, the form and disposition relationships of the drains 107DA, 107DA', 107DB, and 107DB' and the sources 107S and 107S' are the same as those of the drains 107DA, 107DA', 107DB, and 107DB', and sources 107S and 107S' as described above with reference to FIG. 8, except for the form of the gates 105A and 105B.

The first gate 105A and the second gate 105B may extend between the bent portions of the third drain 107DA' included in the second transistor and the bent portion of the fourth drain 107DB' included in a different second transistor. To this end, the space between the mutually adjacent drains 107DA and 107DB in the first transistor group is increased. The bent portion of the first drain 107DA may extend between the third gate 105A' and the fourth drain 107DB', and the bent portion of the second drain 107DB may extend between the fourth gate 105B' and the bent portion of the third drain 107DA'.

In the embodiments as described above, preferably, a distance between the gates and the contact plugs is designed to be maintained to be 1 um or greater. Preferably, a doping concentration of the sources or the drains is adjusted to be 4.0E12 atoms/cm$^2$ or more, and a doping concentration of the substrate is adjusted to be 1.0E10 atoms/cm$^2$ or more. In particular, in order to transfer a high voltage, preferably, a thickness of the gate insulating layer 103 shown in FIG. 6A, FIG. 8A, and FIG. 10A/B is adjusted to 400 or greater.

Preferably, n type impurities having a doping concentration of 2.0E12 atoms/cm$^2$ or more are injected onto the sources or drains to maintain ohmic-contact between the source/drains and the contact plugs.

In accordance with the present disclosure, electrical characteristics and the degree of integration can be enhanced by changing the structure.

While the present invention has been shown and described in connection with the embodiments, it will be apparent to those skilled in the art that modifications and variations can be made without departing from the spirit and scope of the invention as defined by the appended claims.

What is claimed is:

1. A semiconductor device comprising:
a first transistor group including first transistors, wherein each of the first transistors includes a first gate, and a first source and a first drain disposed symmetrically at both sides of the first gate and having a bent portion; and
a second transistor group including second transistors, wherein each of the second transistors includes a second gate, and a second source and a second drain disposed symmetrically at both sides of the second gate and having a bent portion,
wherein the first source and the first drain are bent in a direction opposite to a direction in which the second source and the second drain are bent, and
wherein the bent portion of the second drain extends between the first gate and the bent portion of the first source, and
wherein the bent portion of the first source extends between the second gate and the bent portion of the second drain.

2. The semiconductor device of claim 1, wherein the first drain or the first source include a first portion extending in a direction crossing the first gate and a second portion extending from an end portion of the first portion in a direction parallel to the first gate.

3. The semiconductor device of claim 1, wherein the first gate extends between the second transistors.

4. The semiconductor device of claim 1, further comprising: contact plugs formed on the end portions of the first and second drains and the end portion of the first and second sources.

5. The semiconductor device of claim 4, wherein the contact plugs are arranged in the same line.

6. A semiconductor device comprising:
a plurality of pairs of first transistors, each pair of first transistors including a first source formed on a substrate between a first gate and a second gate, and a first drain and a second drain disposed symmetrically at one side of the first gate and at the other side of the second gate, respectively, and having a bent portion; and
a plurality of pairs of second transistors, each pair of second transistors including a second source formed on a substrate between a third gate and a fourth gate, and a third drain and a fourth drain disposed symmetrically at one side of the first third and at the other side of the fourth gate, respectively, and having a bent portion,
wherein the first and second drains are bent in a direction opposite to a direction in which the third and fourth drains are bent, and
wherein the bent portion of the first drain of the first transistor group extends between the fourth gate and the bent portion of the fourth drain of the second transistor group, and
wherein the bent portion of the fourth drain of the second transistor group extends between the first gate and the bent portion of the first drain of the first transistor group.

7. The semiconductor device of claim 6, wherein the first drain or the second drain includes a first portion extending in a direction crossing the first gate and a second portion extending from an end portion of the first portion in a direction parallel to the first gate.

8. The semiconductor device of claim 6, wherein the first and second gates extend between two pairs of the second transistors.

9. The semiconductor device of claim 6, further comprising: contact plugs formed on the end portions of the first to fourth drains and the first and second sources.

10. The semiconductor device of claim 9, wherein the contact plugs formed on the first to fourth drains are arranged in the same line.

* * * * *